(12) United States Patent
Itami et al.

(10) Patent No.: US 11,916,274 B2
(45) Date of Patent: Feb. 27, 2024

(54) ELECTROMAGNETIC FIELD BAND-STOP FILTER

(71) Applicant: NIPPON TELEGRAPH AND TELEPHONE CORPORATION, Tokyo (JP)

(72) Inventors: Go Itami, Musashino (JP); Yohei Toriumi, Musashino (JP); Ken Okamoto, Musashino (JP); Jun Kato, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 803 days.

(21) Appl. No.: 16/971,728

(22) PCT Filed: Feb. 21, 2019

(86) PCT No.: PCT/JP2019/006605
§ 371 (c)(1),
(2) Date: Aug. 21, 2020

(87) PCT Pub. No.: WO2019/163910
PCT Pub. Date: Aug. 29, 2019

(65) Prior Publication Data
US 2020/0395646 A1    Dec. 17, 2020

(30) Foreign Application Priority Data

Feb. 26, 2018 (JP) .................................. 2018-032270

(51) Int. Cl.
*H01P 1/20* (2006.01)
*H01Q 1/52* (2006.01)
*H01Q 15/00* (2006.01)

(52) U.S. Cl.
CPC ............... *H01P 1/20* (2013.01); *H01Q 1/526* (2013.01); *H01Q 15/0013* (2013.01)

(58) Field of Classification Search
CPC ....................................................... H01P 1/20
(Continued)

(56) References Cited

U.S. PATENT DOCUMENTS

2010/0127943 A1* 5/2010 Inoue .................... H01Q 15/14
343/837

OTHER PUBLICATIONS

Yasunao Suzuki, Masao Masugi, Kimihiro Tajima, Hiroshi Yamane. "Technology for preventing information leakage due to electromagnetic waves emitted from PCs." NTT Technical Journal 2008.8, vol. 20, No. 8 (2008), pp. 11-15. Machine translation attached.

(Continued)

*Primary Examiner* — Rakesh B Patel
(74) *Attorney, Agent, or Firm* — Harness, Dickey & Pierce, P.L.C.

(57) ABSTRACT

An electromagnetic field band-stop filter includes a plurality of unit structures that have reflection characteristics on an electromagnetic wave of a predetermined frequency. Each of the plurality of unit structures includes: a plurality of electrode parts each of which is disposed along a side of a polygon in a non-contact manner with another electrode part; and a plurality of conductor parts which are provided for the plurality of electrode parts on a one-to-one basis and each of which has at least one bent portion between one end and other end, the one ends of the plurality of conductor parts being connected to the electrode parts on a one-to-one basis and the other ends of the plurality of conductor parts being connected at one point on an inner side of the electrode parts in the individual unit structure. The plurality of unit structures are regularly and two-dimensionally disposed by disposing electrode parts of the plurality of unit (Continued)

structures to be adjacent to each other with a spacing that reflects the predetermined frequency.

6 Claims, 23 Drawing Sheets

(58) Field of Classification Search
USPC .......................................... 333/202–204, 211
See application file for complete search history.

(56) References Cited

OTHER PUBLICATIONS

Go Itami, Yohei Toriumi, Shinji Goto, Kazuhiro Takaya, Yu-ichi Hayashi, Naofumi Homma, Takafumi Aoki. "A study on relationship between reconstructed screen images and AM-demodulated frequency characteristics of electromagnetic radiation from mobile devices." Shingakukai General Conference, Mar. 15, 2016. Machine translation attached.

Takehiro Nakamura, Yoshihisa Kishiyama, Anass Benjebbour. "Future Radio Access 10 Years Later: Technical Requirements and Challenges." IEICE Communications Society Magazine No. 19, 2011, Winter Issue, No. 19, pp. 209-219. Machine translation attached.

Shigeru Makino, "Basic Design Theory of Frequency Selective Reflector and its Applications." Institute of Electronics, Information and Communication Engineers, vol. 115, No. 12 (2015), pp. 17-24. Machine translation attached.

Ben A. Munk, "Frequency Selective Surfaces Theory and Design." Apr. 26, 2000.

Go Itami, Yohei Toriumi, Ken Okamoto, Yoshiharu Akiyama. "A study on the adaptive band stop filter using 3 layers of FFS." 2017 Academic Year of Sinology. Sep. 12, 2017. Machine translation attached.

H.V.H. Silva Filho, Crislane Priscila do Nascimento Silva, Manuelle Oliveira, E.M.F. de Oliveira. "Multiband FSS with Fractal Characteristic Based on Jerusalem Cross Geometry." Journal of Microwaves, vol. 16, No. 4 (2017), pp. 932-941.

* cited by examiner

ELECTROMAGNETIC FIELD BAND-STOP FILTER

CROSS-REFERENCE TO RELATED APPLICATIONS

This application is a 371 U.S. National Phase of International Application No. PCT/JP2019/006605, filed on Feb. 21, 2019, which claims priority to Japanese Application No. 2018-032270, filed on Feb. 26, 2018. The entire disclosures of the above applications are incorporated herein by reference.

TECHNICAL FIELD

The present invention relates to an electromagnetic field band-stop filter that reflects electromagnetic waves of a specific frequency.

BACKGROUND ART

With progress in miniaturization and high functionalization of information communication devices, wireless communication service using the information communication devices and wireless lines such as a wireless LAN (Local Area Network) or LTE (Long Term Evolution) (registered trademark) has rapidly become widespread. For example, mobile terminals such as smartphones, tablet terminals, and notebook-type personal computers are becoming indispensable, regardless of whether for business or personal use.

Wireless LAN service such as Wi-Fi (registered trademark) in public spaces, public facilities, hospitals, stores, etc. is rapidly spreading and penetrating in the whole country. Accordingly, transmission and reception of radio waves are widely and frequently performed by wireless communication terminals and devices including the above mobile terminals, and this raises a concern about influence of the radio waves on other electronic devices and apparatuses in the vicinity. In addition, due to the increasing functionality of the devices, a driving frequency of an internal circuit is becoming higher, and this also raises a concern about influence of a radiation noise in a microwave band.

Furthermore, with recent advancement of IoT (Internet of Things), the number of devices is rapidly increasing, and even devices that conventionally do not perform communication now perform wireless communication. This raises a concern about deterioration in the wireless environment and communication failures due to the radiation noise from the devices.

In addition, there has conventionally been pointed out a threat of electromagnetic eavesdropping that steals information through weak electromagnetic waves emitted from electronic devices. For example, there has been a concern about a threat of illegal viewing of screens by using leaking electromagnetic waves from displays or the like used with desktop PCs (personal computers), etc. (for example, see NPL 1).

Such threats, as is the case with the above electronic devices, also apply to the mobile terminals with which opportunities to handle confidential information and personal information are increasing. Signal strength of leaking electromagnetic waves emitted from the mobile terminals is weaker than that emitted from fixed terminals. However, the mobile terminals are frequently used in public spaces, and in many cases, the mobile terminals are used in a situation where distances to other persons are small. As a result, in places where a great number of people gather, it is difficult to identify a hacker among the people. Thus, the mobile terminals, too, have a concern about security threats related to the leaking electromagnetic waves (for example, see NPL 2).

Namely, there are two problems which are (1) the influence of radio waves emitted from the mobile communication terminals and devices upon other peripheral devices and (2) the influence of radiation noise caused by the increase in the number of terminals upon wireless communication and the concerns about the security of communication devices. Thus, a technique for efficiently and optimally controlling the radio wave environment and the electromagnetic environment is urgently needed (for example, see NPL 3).

To address the above problems and threats, the radio wave environment and the electromagnetic environment need to be appropriately controlled. As means for solving the above problems and treats, an FSS (frequency selective surface) used in the field of antenna technology has drawn attention. The FSS is an electromagnetic control material in which a plurality of unit cells are periodically disposed in a two-dimensional manner, each of the unit cells has a structure including a conductor that responds to and resonates with a desired electromagnetic field and an opening portion. The FSS is a material capable of having various frequency characteristics depending on a structure of the unit cell (for example, see NPL 4).

The FSS has a resonator structure having various frequency characteristics. For example, focusing on a band-stop filtering characteristic that reflects a specific frequency, a conductor part of the FSS has a resonance structure.

Examples of a resonator having such a band-stop filtering characteristic include a ring-type resonator, a dipole array resonator, a tripole-type resonator, a cross-shaped resonator, and a patch-type resonator.

Each of these resonators has characteristics of reflecting a specific frequency band and has a feature in which a part of its structure (a ring, a dipole, etc.) matches a specific length (approximately, a wavelength of an incident electric field). There are many structural parameters that need to be considered in frequency designing for the FSS, for example, a resonance frequency shifts depending on the arrangement of the resonator. Also, a balance with other characteristics needs to be considered. Therefore, the frequency designing is complicated in theory (for example, see NPL 5).

CITATION LIST

Non Patent Literature

[NPL 1] Yasunao Suzuki et al., *Denjiha Ni Yoru Jouhou Rouei Wo Boushisuru Denjiha Sekyuritii Taisaku Gijutsu* (Electromagnetic security countermeasure technique for preventing electromagnetic information leakage), NTT Gijutsu Journal (NTT Technical Journal), pp. 11-15, 2008.8

[NPL 2] Go Itami et al., *Mobairu Tanmatsu Kara No Rouei Denjiha Ga Motsu AM Fukuchogono Shuuhasuu Tokusei To Gamen Saigen No Kankei Ni Kansuru Kentou* (A study on relationship between reconstructed screen images and AM-demodulated frequency characteristics of electromagnetic radiation leaking from mobile devices), IEICE General Conference, B-4-60. March 2016

[NPL 3] Takehiro Nakamura et al., "Future Radio Access 10 Years Later: Technical Requirements and Challenges", the Institute of Electronics, Information and Communication Engineers, pp. 209-219, IEICE Communications Society Magazine No. 19, [Winter Issue], 2011

[NPL 4] Shigeru Makino, *Shuuhasuu Sentakuban No Kiso To Oyo* (Foundation and Application of Frequency Selective Reflector), the Institute of Electronics, Information and Communication Engineers, pp. 17-24, A 2015-5, April 2015

[NPL 5] BEN A. MUNK, "Frequency Selective Surfaces Theory and Design" 2000

[NPL 6] Go Itami et al., 3-*Sou FSS Ni Yoru Shuuhasuu Kahen Bando Sutoppu Firuta No Kentou* (A study on Variable Frequency Band Stop Filter by Three-layer FSS), 2017 IEICE General Conference, B-4-29, September 2017

SUMMARY OF THE INVENTION

Technical Problem

When an FSS is used in a specific space for purposes of securing a security protection of radio waves used by an electronic device such as a mobile communication terminal or a wireless LAN and preventing influence of radiation noise emitted from an electronic device upon other devices and electromagnetic information leakage, electromagnetic waves in a target frequency band need to be cut off in a specific area.

A radio frequency band used by an electronic device and a wireless LAN or a frequency band of radiation noise emitted from a device is approximately 300 [MHz] to 6 [GHz]. As an example, assuming that noise in a frequency band of 700 [MHz] or lower is radiated from a mobile communication terminal and, for example, when the frequency band of the radiation noise is 300 [MHz], a wavelength λ of this frequency band reaches a large value of 100 [cm].

With a conventional FSS, the structure of a resonator needs to be matched with a wavelength λ of radiation noise. Consequently, the size of the resonator is inevitably fixed according to a value of the frequency (the wavelength λ). For example, when a wavelength λ of 100 [cm] is to be reflected, unless a certain size of area is prepared, the FSS could not be functioned.

For example, when a frequency band of radiation noise is 300 [MHz] and a wavelength λ of this radiation noise is 100 [cm], even when a resonator is made as small as possible, the resonator needs to be created in a unit cell whose one side has a length of approximately 20 [cm] or longer. To function as an FSS, at least several or more unit cells need to be arranged. Accordingly, unless several square meters or more of space is provided, the resonator cannot be functioned as the FSS.

Since the frequency band of radiation noise from a radio frequency band used for an electronic device such as a mobile terminal or a wireless LAN is not a single frequency band, the radio environment and the electromagnetic environment are complex even in specific space.

Therefore, there is a problem in that a frequency band having trouble needs to be checked to determine, and the trouble cannot be properly handled with the FSS that only works for a specific frequency band.

In addition, once the FSS is manufactured, a resonance frequency band thereof cannot be tuned. Therefore, every time the frequency changes, a new FSS needs to be created from scratch, which requires an immense amount of time, cost, and labor.

A multi-layered structure of the FSS that has been considered adds capacitance (an electric capacity) to the FSS between the layers thereof, namely, only the capacitance increasing effects have been used. Consequently, there is a limit in lowering the resonance frequency, namely, there is a limit in miniaturizing the FSS under the condition where the operating frequency is the same. In addition, with the above conventional structure, while the resonance frequency can be lowered, if the lowering range is increased, the bandwidth becomes wider. As a result, rapid operational characteristics cannot be realized. Namely, while a center frequency of the resonance frequency band can be changed, there is a possibility of cutting off a frequency band therearound which does not need to be cut off (for example, see NPL 6).

The present invention has been made by focusing on the above matters, and an object of the present invention is to provide an electromagnetic field band-stop filter so that a desired frequency characteristic can be obtained.

Means for Solving the Problem

To achieve the above object, according to a first mode of an electromagnetic field band-stop filter in an embodiment of the present invention, the electromagnetic field band-stop filter includes a plurality of unit structures that have reflection characteristics on an electromagnetic wave of a predetermined frequency. Each of the plurality of unit structures includes a plurality of electrode parts each of which is disposed along a side of a polygon in a non-contact manner. Each of the plurality of unit structures includes a plurality of conductor parts. The plurality of conductor parts are provided for the plurality of electrode parts on a one-to-one basis, and each of the conductor parts has at least one bent portion between one end and the other end thereof. The one ends of the plurality of conductor parts are connected to the electrode parts on a one-to-one basis, and the other ends of the plurality of conductor parts are connected at one point on an inner side of the electrode parts in the individual unit structure. In the first mode, the plurality of unit structures are regularly and two-dimensionally disposed by disposing electrode parts of the plurality of unit structures to be adjacent to each other with a spacing that reflects the predetermined frequency.

According to a second mode of the electromagnetic field band-stop filter of the present invention, in the first mode, each of the plurality of electrode parts has a flat-plate portion and is disposed in such a manner that a long side of the flat-plate portion is disposed along a side of the polygon. In the second mode, the electromagnetic field band-stop filter further includes a sub-resonator forming a conductive plate that is disposed overlapping at least a part of the flat-plate portion of each of the adjacent electrode parts with a predetermined spacing therebetween and that adds electrical capacitance in parallel to electrical capacitance which the adjacent electrode parts have.

According to a third mode of the electromagnetic field band-stop filter of the present invention, in the second mode, a spacing between the sub-resonator and the electrode part is one tenth or less of an arrangement spacing between the plurality of unit structures.

According to a fourth mode of the electromagnetic field band-stop filter of the present invention, in the first mode, the bent portion of the conductor part has a shape forming an outline between one end and the other end of the conductor part. In the fourth mode, the electromagnetic field band-stop filter further includes a sub-resonator. The sub-resonator has a ring shape corresponding to a shape of an outline formed by the bent portion of the conductor part. The sub-resonator is disposed in such a manner that at least a part of the ring shape two-dimensionally overlaps with at least a part of the bent portion of the conductor part so that, when a current flows through the ring shape, a direction of the current in at least a part of the ring shape becomes the same as, when a current flows through the conductor part, a direction of the current in at least a part of the bent portion of the conductor part.

According to a fifth mode of the electromagnetic field band-stop filter of the present invention, in the fourth mode, a spacing between the sub-resonator and the conductor part is one tenth or less of an arrangement spacing between the plurality of unit structures.

According to a sixth mode of the electromagnetic field band-stop filter of the present invention, in the fourth mode, a length of the conductor part in a short-side direction is shorter than a short side of the electrode part.

According to a seventh mode of the electromagnetic field band-stop filter of the present invention, in the first mode, each of the plurality of electrode parts has a flat-plate portion and is disposed in such a manner that a long side of the flat-plate portion is disposed along a side of the polygon. The bent portion of the conductor part has a shape forming an outline between one end and the other end of the conductor part. In the seventh mode, the electromagnetic field band-stop filter further includes a first sub-resonator and a second sub-resonator. The first sub-resonator forms a conductive plate that is disposed overlapping at least a part of the flat-plate portion of each of the adjacent electrode parts with a predetermined spacing therebetween and that adds electrical capacitance in parallel to electrical capacitance which the adjacent electrode parts have. The second sub-resonator has a ring shape corresponding to a shape of an outline formed by the bent portion of the conductor part. The second sub-resonator is disposed in such a manner that at least a part of the ring shape two-dimensionally overlaps with at least a part of the bent portion of the conductor part so that, when a current flows through the ring shape, a direction of the current in at least a part of the ring shape becomes the same as, when a current flows through the conductor part, a direction of the current in at least a part of the bent portion of the conductor part.

Effects of the Invention

According to a first, fourth, fifth, and sixth modes of an electromagnetic field band-stop filter of an embodiment of the present invention, inductance of a resonator can be increased.

According to a second and third modes of an electromagnetic field band-stop filter of an embodiment of the present invention, capacitance of a resonator can be increased.

According to a seventh mode of an electromagnetic field band-stop filter of an embodiment of the present invention, inductance and capacitance of a resonator can be increased.

Namely, according to the present invention, desired frequency characteristics can be obtained.

DESCRIPTION OF EMBODIMENTS

Hereinafter, an embodiment according to the present invention will be described with reference to the drawings.

Figure 1:
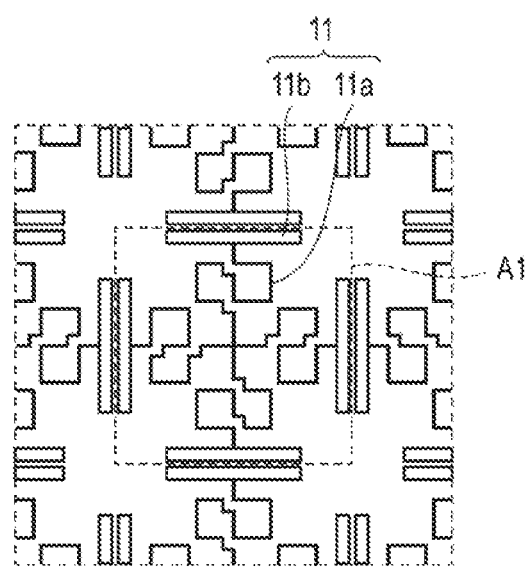
FIG. 1 illustrates an application example of a main resonator of an electromagnetic field band-stop filter according to an embodiment of the present invention.
Figure 2:
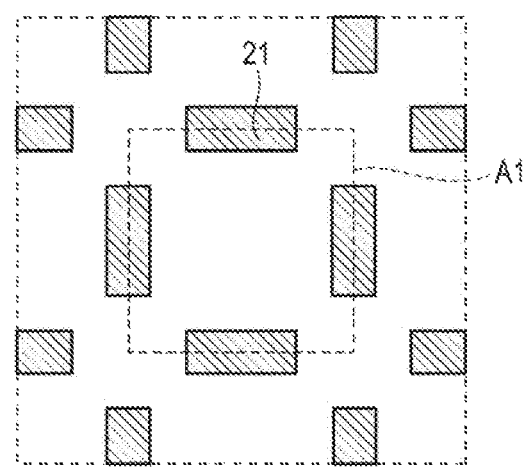
FIG. 2 illustrates an application example of a patch-type sub-resonator of an electromagnetic field band-stop filter according to an embodiment of the present invention.
Figure 3:
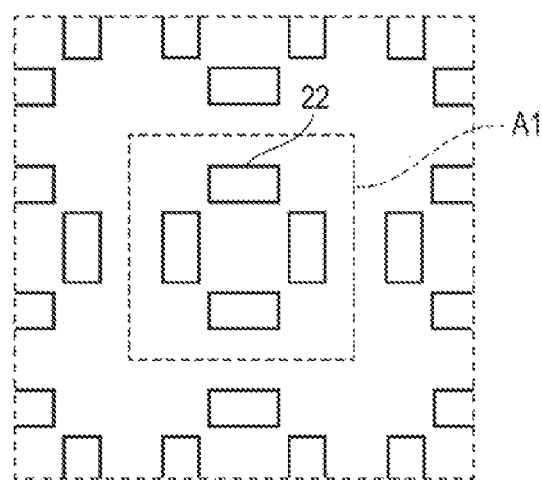
FIG. 3 illustrates an application example of a ring-type sub-resonator of an electromagnetic field band-stop filter according to an embodiment of the present invention.

FIG. 1 illustrates an application example of a main resonator of an electromagnetic field band-stop filter according to an embodiment of the present invention. FIG. 2 illustrates an application example of a patch-type sub-resonator of an electromagnetic field band-stop filter according to an embodiment of the present invention. FIG. 3 illustrates an application example of a ring-type sub-resonator of an electromagnetic field band-stop filter according to an embodiment of the present invention.

In the present embodiment, a structure illustrated in FIG. 1 is used as a main resonator 11 of an electromagnetic field band-stop filter. In the present embodiment, a structure illustrated in FIG. 2 is used as a patch (rectangular conductor plate)-type sub-resonator (hereinafter, referred to as a patch-type resonator 21) of an electromagnetic field band-stop filter. In the present embodiment, a structure illustrated in FIG. 3 is used as a ring-type sub-resonator (hereinafter, referred to as a ring-type resonator 22) of an electromagnetic field band-stop filter. Each structure will be described below.

In the present embodiment, an FSS is constituted by regularly arranging unit structures A1 (each of which is represented by a section surrounded by a dotted line in FIGS. 1 to 3, and also referred to as a unit cell) in a two-dimensional plane. The individual unit structure A1 is generated by forming conductive geometric patterns on a substrate made of a dielectric material.

Figure 4:
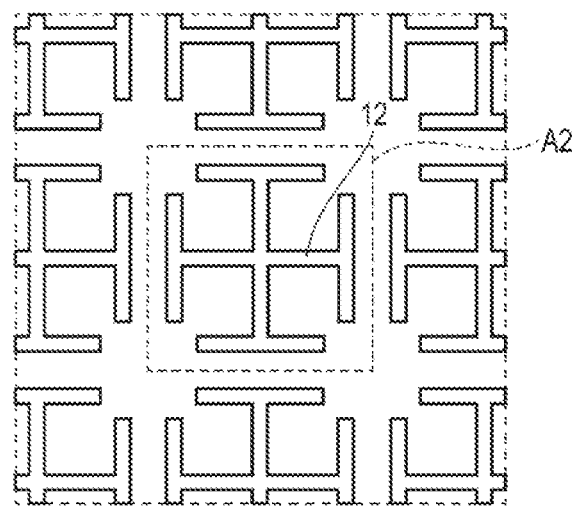
FIG. 4 illustrates an example of a Jerusalem cross-type resonator.

FIG. 4 illustrates an example of a Jerusalem cross-type resonator. To realize the miniaturization of a resonator, the variability of frequency characteristics, and steeper cutoff characteristics, the main resonator 11 in the present embodiment adopts a conductor part of a unit structure A2 of the Jerusalem cross-type resonator illustrated in FIG. 4, the conductor part forming a figure-eight shaped wiring. The Jerusalem cross-type resonator is a representative resonator of the band-stop structure.

Next, a configuration of the main resonator 11 will be described. The main resonator 11 illustrated in FIG. 1 includes a conductive wire part (conductor part) 11a that is an unbranched wiring having at least one bent portion between one end and the other end and an electrode plate part (electrode part) 11b that is a rectangular conductor part provided for the conductive wire part 11a on a one-to-one basis. The bent portion may have a shape forming an outline between the one end and the other end.

A long side and a short side of the electrode plate part 11b are sufficiently longer than a length of the conductive wire part 11a in a short-side direction.

The unit structure A1 illustrated in FIG. 1 has a polygonal shape, which is a regular square pattern in this embodiment. Namely, the individual unit structure A1 has four conductive wire parts 11a and four electrode plate parts 11b each of which has a flat-plate portion and is disposed in such a manner that the long side of the flat-plate portion is disposed along a side of the polygon, which is the regular square in this embodiment. In addition, the conductive wire parts 11a and the electrode plate parts 11b are electrically connected to each other on a one-to-one basis in the same unit structure A1. The electrode plate parts 11b in the same unit structure A1 are disposed in a non-contact manner without intersecting with one another. One end of the individual conductive wire part 11a is electrically connected to the midpoint of the long-side portion of the individual electrode plate part 11b on the inner side of the unit structure A1.

The individual electrode plate part 11b in one unit structure A1 is disposed adjacent to another electrode plate part 11b in a different unit structure A1 located adjacent to this unit structure A1 including the electrode plate part 11b. The spacing between these adjacent electrode plate parts 11b is set to a distance that is reflective of a frequency that needs to be reflected.

In the present embodiment, the reflection characteristics on a 200 MHz band is set to the unit structure as a predetermined frequency. This is the lowest band of the frequency bands that need to be prevented from leaking. Of course, the target frequency is not limited to a 200 MHz band. The target frequency may be arbitrarily determined based on the environment, etc.

In the example illustrated in FIG. 1, to increase the inductance of the resonator by extending the effective length of the conductive wire part 11a as much as possible, as described above, the conductive wire part 11a forms a figure-eight shape between one end and the other end thereof without branching. The figure-eight shaped conductive wire part 11a illustrated in FIG. 1 is merely an example. As long as the bent portion is provided between the one end and the other end to extend the effective length of the conductive wire part 11a, the shape of the conductive wire part 11a is not particularly limited.

In other words, the above unit structure A1 includes four structural bodies having an identical structure each constituted by connecting one end of a single conductive wire part 11a and a single electrode plate part 11b, and the other end of the conductive wire part 11a of each structural body is connected at a common connection point. These four structural bodies in such state are two-dimensionally and radially disposed with the common connection point at the center and with equal angular intervals of 90°. In this way, the above unit structure A1 is formed.

Every unit structure A1 has a symmetrical shape with respect to its center point. Namely, in the individual unit structure A1, each electrode plate part 11b has the same length, and the conductive wire part 11a extends toward the inner side of the unit structure A1 from the midpoint of the long side of the electrode plate part 11b. The other end of each conductive wire part 11a extending toward the inner side is connected with the others at one point on the inner side, when seen from the electrode plate part 11b, of the electrode parts in the regular square unit structure A1. Namely, the individual conductive wire part 11a of the unit structure A1 serves as a conductor member that is formed along the figure-eight shape and connects the orthocenter of the regular square of the unit structure A1 and each of the electrode plate parts 11b. The main resonator 11, the patch-type resonator 21, and the ring-type resonator 22 are constituted by conductors in the unit structure A1 of the FSS.

Next, a principle of an operation of the main resonator 11 will be described. In the main resonator 11, inductance L of the conductive wire part 11a and capacitance C of the electrode plate part 11b are arranged in series. A current flowing through the main resonator 11 increases at resonance, and when an electric field is generated in a direction opposite to incident electromagnetic waves to the main resonator 11 by the movement of electrons, the main resonator 11 works as a band-stop filter that cuts off the incident electromagnetic waves.

While a principle of an operation of a conventional FSS that is not miniaturized is qualitatively expressed by a circuit representation as described above, strictly speaking, the conventional FSS follows the Floquet theory regarding a periodic structure. However, by increasing inductance and capacitance of a unit structure to make a wavelength that the unit structure handles at resonance sufficiently larger than the size of the unit structure, a resonance principle can be designed based on a lumped constant circuit of the unit structure.

Next, features of the main resonator 11 will be described.

A feature of the conductive wire part 11a of the main resonator 11 is that the width, for example, the outer diameter is designed to be as small as possible.

Figure 5:
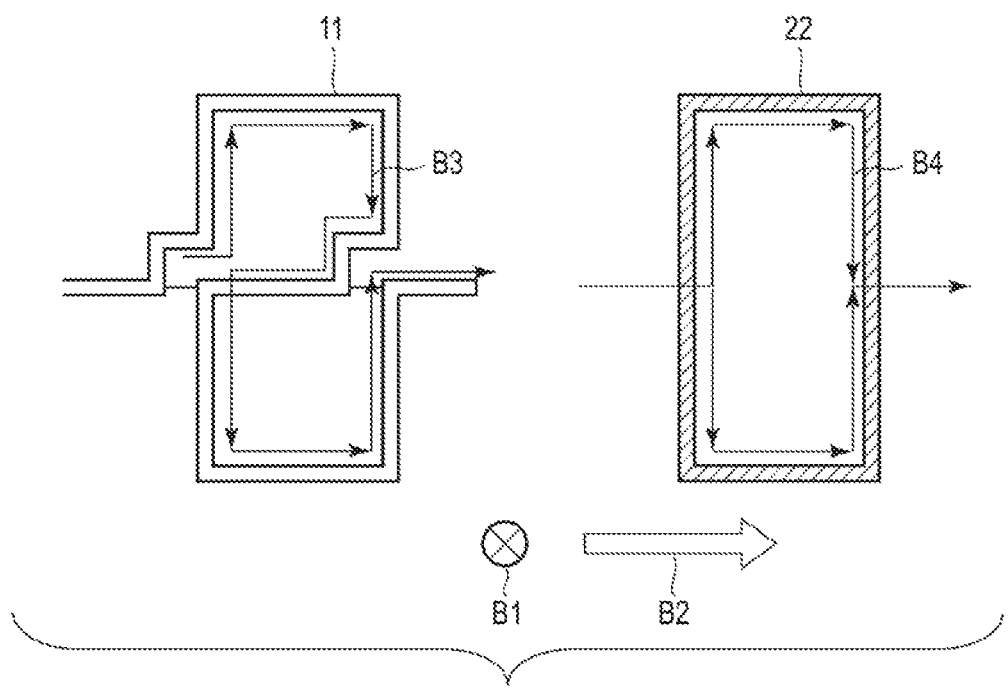
FIG. 5 illustrates an example of a direction of a current flowing through a main resonator and a direction of a current flowing through a ring-type sub-resonator of an electromagnetic field band-stop filter according to an embodiment of the present invention.

FIG. 5 illustrates an example of a direction of a current flowing through a main resonator and a direction of a current flowing through a ring-type sub-resonator of an electromagnetic field band-stop filter according to an embodiment of the present invention.

In the example illustrated in FIG. 5, by applying the above figure-eight shape to the conductive wire part 11a between its one end and the other end, a direction B3 and a direction B4 are designed to be the same direction at portions where a part of a current path of the conductive wire part 11a and a part of a current path of the ring-type resonator 22 two-dimensionally overlap with each other. The direction B3 is the direction of a current flowing through the conductive wire part 11a by the electric field that is induced by an incident electromagnetic wave which is incident along a direction B1 and generated along a direction B2 orthogonal to the direction B1. The direction B4 is the direction of a current flowing through the ring-type resonator 22, which will be described below.

As illustrated in FIG. 5, by applying the figure-eight shape to the conductive wire part 11a, the effective length can be extended, compared with a case where the figure-eight shape is not applied to the conductive wire part 11a. In this way, the inductance of the resonator can be increased. In addition, by designing the width of the conductive wire part 11a sufficiently smaller than the long side and the short side of the electrode plate part 11b, the inductance of the resonator can be increased.

In addition, as a feature of the electrode plate part 11b, the long side thereof is designed to be as long as possible to increase the capacitance of the resonator. In addition, to reduce a parasitic inductance component, the short side of the electrode plate part 11b is designed to be sufficiently longer than the length of the conductive wire part 11a in the short side direction. In addition, to increase the capacitance of the resonator, the spacing between the adjacent electrode plate parts 11b of different unit structures A1 is set as small as possible.

In addition, by preparing two main resonators 11 having the same structure, which is illustrated in FIG. 1, and adopting a configuration (without using a sub-resonator) in which these main resonators 11 two-dimensionally oriented in the same direction are disposed overlapping with each other in a non-contact manner, the inductance of the resonator can be increased. This configuration does not include a configuration in which the main resonators 11 overlap with each other in a contact manner without any spacing or a configuration in which the main resonators 11 are disposed at respective positions displaced from each other, namely, a configuration in which the main resonators 11 are displaced in the plane direction.

It is desirable that the spacing between the two main resonators 11 overlapping with each other as described above be one tenth or less of an arrangement spacing which is a spacing between the center points of the respective unit structures. This is because a resonance wavelength of the resonator is approximately the same as the arrangement spacing so that the above spacing between the main resonators 11 overlapping with each other will be sufficiently smaller than the resonance wavelength.

The configuration is not limited to the above configuration in which the two main resonators 11 two-dimensionally oriented in the same direction are disposed overlapping with each other. Alternatively, by adopting a configuration in which three or more main resonators 11 having the same structure are prepared and two-dimensionally oriented in the same direction to be disposed overlapping with one another, the inductance of the resonator can be increased.

Next, features of the sub-resonators will be described. The sub-resonators are classified as the patch-type resonator 21 or the ring-type resonator 22 described above.

The patch-type resonator 21 has a plate-like shape and is a conductive plate having short sides and long sides. Each short side is longer than a distance between the adjacent electrode plate parts 11b in different unit structures A1 of the main resonator 11. Each long side has a length equal to or less than the long side of the electrode plate part 11b and is disposed along a side of the polygon of the unit structure A1.

To increase the capacitance of the resonator, the patch-type resonator 21 is disposed across over the adjacent electrode plate parts 11b in different unit structures A1 in the main resonator 11 in such a manner that the patch-type resonator 21 overlaps at least a part of the flat-plate portion of each of these electrode plate parts 11b with a predetermined spacing therebetween and that at least a part of the patch-type resonator 21 and at least a part of the electrode plate part 11b two-dimensionally overlap with each other. A height (a length perpendicular to the plane direction) of the patch-type resonator 21 is sufficiently shorter than the arrangement spacing between the center points of the unit structures A1. The patch-type resonator 21 electrically couples the adjacent electrode plate parts 11b described above and adds electrical capacitance in parallel to the electrical capacitance that these electrode plate parts 11b have.

The ring-type resonator 22 has a ring shape that corresponds to the shape of the outline formed by the bent portion of the conductive wire parts 11a. To increase the inductance of the resonator, the ring-type resonator 22 is disposed in such a manner that at least a part of the ring shape of the ring-type resonator 22 two-dimensionally overlaps with a part of the bent portion of the conductive wire part 11a of the main resonator 11, for example, a least a part of an outer peripheral portion of the figure-eight shape. A height of the ring-type resonator 22 is sufficiently shorter than the above arrangement spacing. By causing the direction of a current flowing through the ring-type resonator 22 to match with the direction of a current flowing through the figure-eight structure of the conductive wire part 11a of the main resonator 11, magnetic effects (magnetic coupling effects) are obtained.

First Application Example

Figure 6:
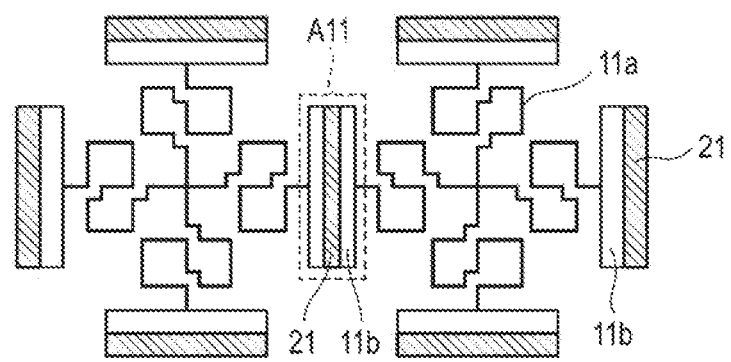
FIG. 6 illustrates a first application example of a combination of a main resonator and a sub-resonator of an electromagnetic field band-stop filter according to an embodiment of the present invention.

Next, a first application example of a combination of a main resonator and a sub-resonator of an electromagnetic field band-stop filter according to an embodiment of the present invention will be described. FIG. 6 illustrates a first application example of a combination of a main resonator and a sub-resonator of an electromagnetic field band-stop filter according to an embodiment of the present invention.

As illustrated in FIG. 6, in the first application example, an electromagnetic field band-stop filter is constituted by combining the electrode plate parts 11b of the main resonator 11 illustrated in FIG. 1 and the patch-type resonators 21 illustrated in FIG. 2.

In the example illustrated in FIG. 6, at least a part of the flat-plate portion of each of the adjacent electrode plate parts 11b in different unit structures A1 shares a plane with at least a part of the flat-plate portion of the patch-type resonator 21. Namely, the patch-type resonator 21 and the adjacent electrode plate parts 11b described above are disposed overlapping with each other to form two layers.

When the patch-type resonator 21 and the electrode plate parts 11b overlap with each other as described above, it is desirable that the spacing between the patch-type resonator 21 and the electrode plate parts 11b be one tenth or less of an arrangement spacing which is a spacing between the center points of the respective unit structures. This is because a resonance wavelength of the resonator is approximately the same as the arrangement spacing so that the above spacing between the layers will be sufficiently smaller than the resonance wavelength.

Figure 7:
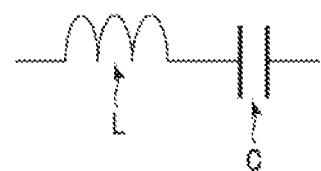
FIG. 7 illustrates an example of an equivalent circuit in a case where a patch-type resonator is not combined with an electrode plate part of a main resonator.
Figure 8:
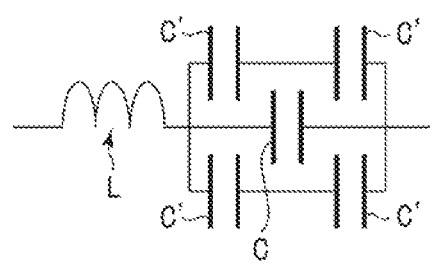
FIG. 8 illustrates an example of an equivalent circuit in a case where a patch-type resonator is combined with an electrode plate part of a main resonator.

FIG. 7 illustrates an example of an equivalent circuit in a case where a patch-type resonator is not combined with an electrode plate part of a main resonator. FIG. 8 illustrates an example of an equivalent circuit in a case where a patch-type resonator is combined with an electrode plate part of a main resonator.

When the patch-type resonator 21 is not combined with the electrode plate part 11b of the main resonator 11, the unit structure can equivalently be handled as a series circuit including an inductance L and a capacitance C as illustrated in FIG. 7.

Alternatively, when the patch-type resonator 21 is combined with the electrode plate part 11b of the main resonator 11, as illustrated in FIG. 8, capacitances C can be added in parallel to a capacitance C that the electrode plate part 11b of the main resonator 11 has. In this way, a resonance frequency of the resonator can be lowered, compared with the case where no extra capacitances are added. Namely, the resonator can be miniaturized under a condition where the resonance frequency is the same.

Figure 9:
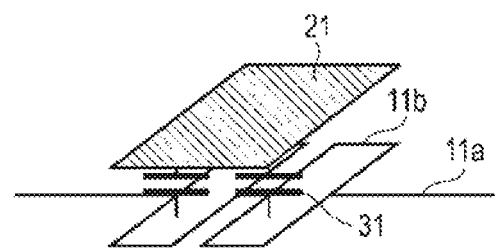
FIG. 9 illustrates an example of a configuration in which substrates serving as dielectrics are sandwiched between electrode plate parts of a main resonator and a patch-type resonator.

FIG. 9 illustrates an example of a configuration in which substrates serving as dielectrics are sandwiched between electrode plate parts of a main resonator and a patch-type resonator. The configuration illustrated in FIG. 9 relates to a section represented by a range A11 illustrated in FIG. 6.

In addition, when the electrode plate parts 11b and the patch-type resonator 21 are combined with each other as described above, by adopting a configuration in which substrates 31 serving as dielectrics are sandwiched between layers, namely, between the electrode plate parts 11b and the patch-type resonator 21 as illustrated in FIG. 9, the value of the above additional capacitances can be increased. Therefore, with this configuration, the resonance frequency described above can be further lowered, compared with a configuration in which no substrates serving as dielectrics are sandwiched. Namely, the resonator can be further miniaturized.

Alternatively, by disposing two patch-type resonators 21 in such a manner to sandwich the electrode plate parts 11b of the main resonator 11 to form a three-layer combination, the above additional capacitances can be increased further, compared with the above case with two layers, and the above resonance frequency can be further lowered.

In addition, by applying a configuration in which substrates serving as dielectrics are sandwiched between a first patch-type resonator 21 and the electrode plate parts 11b and between a second patch-type resonator 21 and the electrode plate parts 11b, respectively, to the above three-layer configuration,
the value of the above additional capacitances can be further increased. As a result, the above resonance frequency can be further lowered, compared with the case where no substrates serving as dielectrics are sandwiched in the three-layer configuration.

Second Application Example

Figure 10:
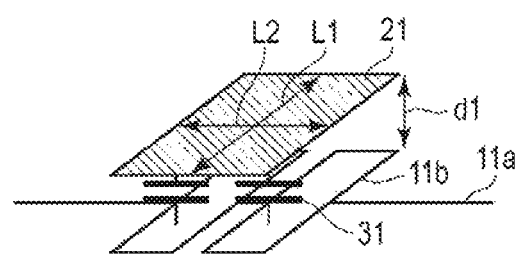
FIG. 10 illustrates a second application example of a combination of a main resonator and a sub-resonator of an electromagnetic field band-stop filter according to an embodiment of the present invention.

Next, a second application example of a combination of a main resonator and a sub-resonator of an electromagnetic field band-stop filter according to an embodiment of the present invention will be described. FIG. 10 illustrates a second application example of a combination of a main resonator and a sub-resonator of an electromagnetic field band-stop filter according to an embodiment of the present invention.

As described in FIG. 10, in the second application example, by changing a length L1 of the long side of the patch-type resonator 21 described in the first application example, a length L2 of the short side thereof, or a distance d1 between the patch-type resonator 21 and the electrode plate part 11b, the magnitude of the capacitance of the resonator changes. Consequently, the resonance frequency of the resonator also changes. The same applies to the combination of two layers or three layers of the patch-type resonators 21 and the electrode plate part 11b.

Namely, the resonance frequency can be selected by changing the size of the patch-type resonator 21 as a sub-resonator, or changing the distance d1 between the individual patch-type resonator 21 and the electrode plate part 11b.

Since the patch-type resonator 21 serving as a sub-resonator is disposed in a different layer from that of the electrode plate part 11b of the main resonator 11, these components can separately be carried before the resonator is used. Namely, by preparing the patch-type resonators 21 of various sizes and appropriately selecting the size of the patch-type resonator 21 and the above distance d1, the magnitude of the capacitance to be added can be changed so that the resonance frequency band can be selected.

Third Application Example

Figure 11:
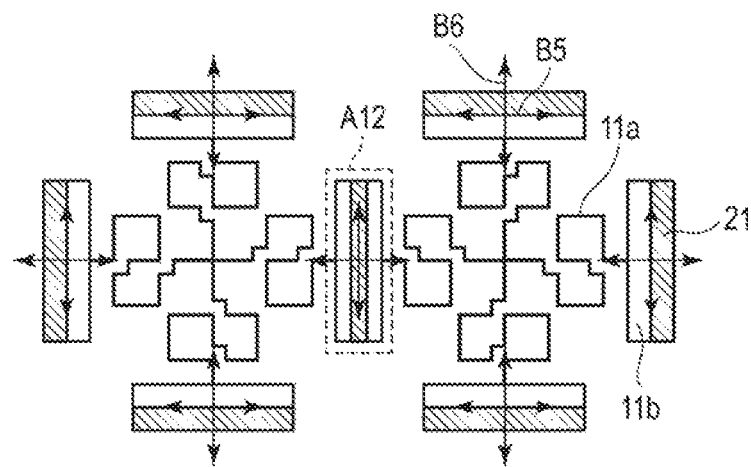
FIG. 11 illustrates a third application example of a combination of a main resonator and a sub-resonator of an electromagnetic field band-stop filter according to an embodiment of the present invention.
Figure 12:
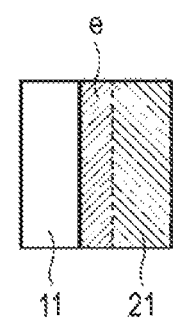
FIG. 12 illustrates an example of disposition of an electrode plate part of the main resonator and the patch-type resonator in the third application example of the combination of the main resonator and the sub-resonator of the electromagnetic field band-stop filter according to the embodiment of the present invention.

Next, a third application example of a combination of a main resonator and a sub-resonator of an electromagnetic field band-stop filter according to an embodiment of the present invention will be described. FIG. 11 illustrates a third application example of a combination of a main resonator and a sub-resonator of an electromagnetic field band-stop filter according to an embodiment of the present invention. FIG. 12 illustrates an example of disposition of an electrode plate part of the main resonator and the patch-type resonator in the third application example of the combination of the main resonator and the sub-resonator of the electromagnetic field band-stop filter according to the embodiment of the present invention. A configuration illustrated in FIG. 12 relates to a section represented by a range A12 illustrated in FIG. 11.

In the third application example, when a state in which a capacitance is added to the resonator by the patch-type resonator 21 described in the first application example is obtained, namely, when a state in which, as illustrated in FIG. 12, there is a range e where the electrode plate part 11b and the patch-type resonator 21 two-dimensionally overlap with each other is obtained, as illustrated in FIG. 11, by two-dimensionally displacing an arrangement position of the patch-type resonator 21 along a direction B5 of a long side of the electrode plate part 11b or along a direction B6 of a short side of the electrode plate part 11b, the capacitance formed by the electrode plate part 11b of the main resonator 11 and the patch-type resonator 21 changes. Therefore, the resonance frequency of the resonator changes. The same applies to the combination of two layers or three layers of the patch-type resonators 21 and the electrode plate part 11b.

In this way, in the third application example, only by changing the arrangement position of the patch-type resonator 21 with respect to the electrode plate part 11b, the resonance frequency of the resonator can flexibly be changed without changing the main resonator 11.

Fourth Application Example

Figure 13:
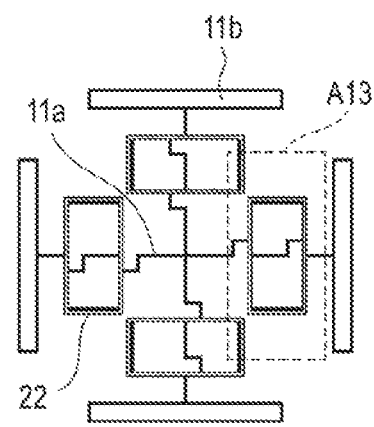
FIG. 13 illustrates a fourth application example of a combination of a main resonator and a sub-resonator of an electromagnetic field band-stop filter according to an embodiment of the present invention.
Figure 14:
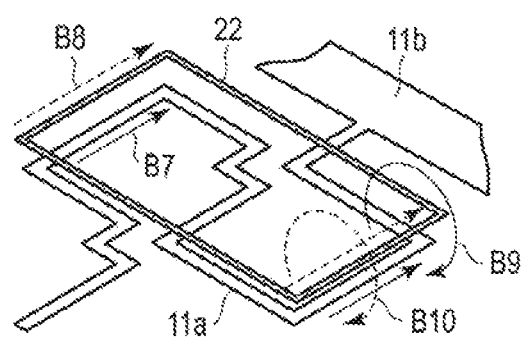
FIG. 14 illustrates an example of disposition of a conductive wire part of the main resonator and the ring-type resonator in the fourth application example of the combination of the main resonator and the sub-resonator of the electromagnetic field band-stop filter according to the embodiment of the present invention.

Next, a fourth application example of a combination of a main resonator and a sub-resonator of an electromagnetic field band-stop filter according to an embodiment of the present invention will be described. FIG. 13 illustrates a fourth application example of a combination of a main resonator and a sub-resonator of an electromagnetic field band-stop filter according to an embodiment of the present invention. FIG. 14 illustrates an example of disposition of a conductive wire part of the main resonator and the ring-type resonator in the fourth application example of the combination of the main resonator and the sub-resonator of the electromagnetic field band-stop filter according to the embodiment of the present invention.

As illustrated in FIG. 13, in the fourth application example, the electromagnetic field band-stop filter is constituted by combining the ring-type resonator illustrated in FIG. 3 with the conductive wire part 11a of the main resonator 11 illustrated in FIG. 1.

In the example illustrated in FIG. 14, the ring-type resonator 22 has a ring shape that corresponds to the shape of the outline of the bent portion of the conductive wire part 11a. To increase the inductance of the resonator, the ring-type resonator 22 is disposed in such a manner that at least a part of the ring shape of this ring-type resonator 22 two-dimensionally overlaps with at least a part of an outer peripheral portion of the conductive wire part 11a of the main resonator 11 forming the figure-eight shape.

When the ring-type resonator 22 and the conductive wire part 11a overlap with each other as described above, it is desirable that the spacing between the ring-type resonator 22 and the conductive wire part 11a be one tenth or less of an arrangement spacing which is a spacing between the center points of the respective unit structures. This is because a resonance wavelength of the resonator is approximately the same as the arrangement spacing so that the above spacing between the layers will be sufficiently smaller than the resonance wavelength.

In addition, it is desirable that a length of the ring-type resonator 22 in the short-side direction be 20% or less of a length of the short side of the electrode plate part 11b in the fourth application example. For example, it is desirable that, when a length of the short side of the electrode plate part 11b is 1 [mm], a length of the ring-type resonator 22 in the short side direction be 0.2 [mm] or less. This is because, under a condition where the size of the electrode plate part 11b is the same, the inductance of the resonator can easily be increased when the length of the ring-type resonator 22 in the short side direction is shorter. Namely, under a condition where the size of the unit structure is the same, the inductance of the resonator can easily be increased.

In addition, by causing, in the section where the conductive wire part 11a of the main resonator 11 and the ring-type resonator 22 overlap with each other, a direction B7 of a current flowing through the conductive wire part 11a of the main resonator 11 to be matched with a direction B8 of a current flowing through the ring-type resonator 22, a direction B9 and a direction B10 can be matched with each other. The direction B9 is the direction of a magnetic field generated by the conductive wire part 11a of the main resonator 11 in the above section where the conductive wire part 11a of the main resonator 11 and the ring-type resonator 22 overlap with each other. The direction B10 is the direction of a magnetic field generated by the ring-type resonator 22. In this way, the magnetic effects can be added to the figure-eight shaped conductive wire part 11a of the main resonator 11. Thus, the effective inductance of the resonator can be increased, and the resonance frequency can be lowered.

In other words, since the direction of the current flowing through a part of the ring-type resonator 22 is the same as the direction of the current flowing through a part of the conductive wire part 11a of the main resonator 11 as described above, compared with the case where the ring-type resonator 22 is not disposed, the magnetic field generated by the above current is increased by the amount of the current flowing through the ring-type resonator 22. As a result, a magnetic field in the opposite direction in accordance with Len's Law and a reverse current generated by this magnetic field are both increased, and a phase delay in the main resonator 11 is increased. Thus, the effective inductance of the resonator can be increased.

Alternatively, by disposing two ring-type resonators 22 in such a manner to sandwich the conductive wire part 11a of the main resonator 11 to form a three-layer combination, the above additional effective inductance can be increased further, compared with the above case with the two-layer combination. Thus, the above resonance frequency can be further lowered.

Two or more layers of ring-type resonators 22 can be arranged onto the upper and lower layers of the conductive wire part 11a, respectively. Thus, by increasing the number of overlapping layers, the effective inductance can be further increased. Thus, the resonance frequency can be further lowered.

In the present embodiment, since the FSS can be designed by using a lumped constant model, a Q-factor (bandwidth) of cutoff characteristics can be described as a function of a ratio of the inductance to the capacitance. Namely, when the inductance is represented by L, the capacitance is represented by C, and the resistance is represented by R, the Q-factor (Q) is obtained by the following formula (1). Accordingly, by increasing the inductance L, the Q-factor is increased, and steeper frequency characteristics of the resonator can be obtained.

$$Q=1/R\sqrt{(L/C)} \qquad \text{Formula (1)}$$

Fifth Application Example

Figure 15:
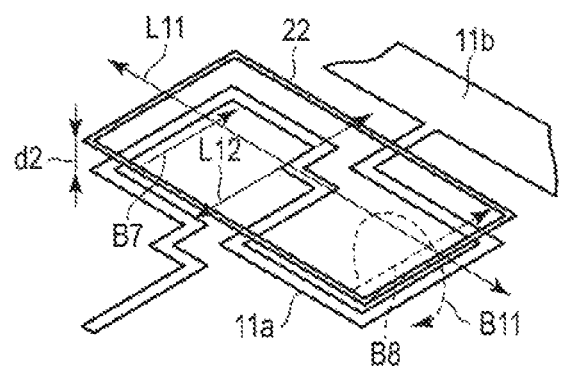
FIG. 15 illustrates a fifth application example of a combination of a main resonator and a sub-resonator of an electromagnetic field band-stop filter according to an embodiment of the present invention.

Next, a fifth application example of a combination of a main resonator and a sub-resonator of an electromagnetic field band-stop filter according to an embodiment of the present invention will be described. FIG. 15 illustrates a fifth application example of a combination of a main resonator and a sub-resonator of an electromagnetic field band-stop filter according to an embodiment of the present invention.

As illustrated in FIG. 15, in the fifth application example, a length L11 of the long side of the ring of the ring-type resonator 22 described in the fourth application example, a length L12 of the short side thereof, or a distance d2 between the ring-type resonator 22 and the conductive wire part 11a is changed. With this change, the magnitude of reverse current flowing through the main resonator 11 is changed, the reverse current generated by a magnetic field in the reverse direction (a direction B11) generated in a portion where the ring-type resonator 22 and the conductive wire part 11a overlap with each other. Thus, the magnitude of the effective inductance is changed. Thus, the resonance frequency of the resonator can be changed.

In addition, since the ring-type resonator 22 serving as the sub-resonator is disposed in a different layer from that of the conductive wire part 11a of the main resonator 11, these components can separately be carried before the resonator is used. Namely, by preparing the ring-type resonators 22 of various sizes and appropriately selecting the size of the ring-type resonator 22 and the above distance d2, the magnitude of the effective inductance can be changed so that the resonance frequency band can be selected.

Sixth Application Example

Figure 16:
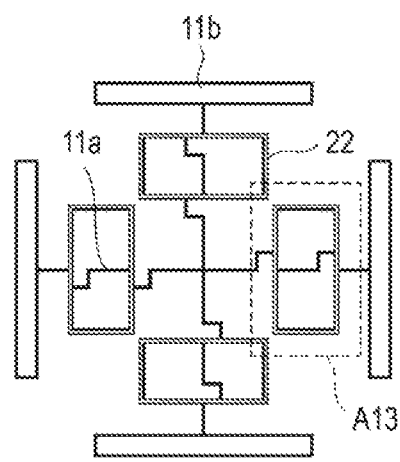
FIG. 16 illustrates a sixth application example of a combination of a main resonator and a sub-resonator of an electromagnetic field band-stop filter according to an embodiment of the present invention.
Figure 17:
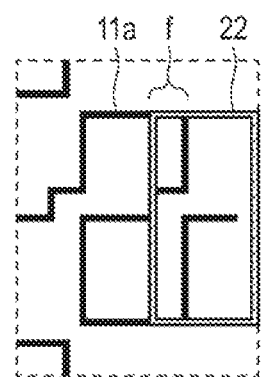
FIG. 17 illustrates an example of disposition of a conductive wire part of the main resonator and the ring-type resonator in the sixth application example of the combination of the main resonator and the sub-resonator of the electromagnetic field band-stop filter according to the embodiment of the present invention.

Next, a sixth application example of a combination of a main resonator and a sub-resonator of an electromagnetic field band-stop filter according to an embodiment of the present invention will be described. FIG. 16 illustrates a sixth application example of a combination of a main resonator and a sub-resonator of an electromagnetic field band-stop filter according to an embodiment of the present invention. FIG. 17 illustrates an example of disposition of a conductive wire part of the main resonator and the ring-type resonator in the sixth application example of the combination of the main resonator and the sub-resonator of the electromagnetic field band-stop filter according to the embodiment of the present invention.

In the sixth application example, a state in which at least a part of the ring-type resonator 22 described in the fourth application example two-dimensionally overlaps with an outer peripheral portion of the figure-eight shape of the conductive wire part 11a in the main resonator 11 is maintained. Next, in this state, in a plane, the arrangement position of the ring-type resonator 22 is made to be a state in which a range f where the ring-type resonator 22 and the conductive wire part 11a overlap with each other remains, as illustrated in FIG. 17. In this state, if the planar direction B5 of the long side of the conductive wire part 11a or the planar direction B6 of the short side of the conductive wire part 11a is displaced toward the long-side direction/short-side direction of the rectangular conductor ring, the amount of reverse current induced by the figure-eight shaped conductive wire part 11a of the main resonator 11 is changed. Thus, the magnitude of the effective inductance is changed, and the resonance frequency of the resonator is changed.

In addition, it is desirable that the amount of displacement be one tenth or less of an arrangement spacing which is a spacing between the center points of the respective unit structures, where the amount of displacement means an amount of displacement, while the arrangement position of the ring-type resonator 22 is kept in the state in which the range f where the ring-type resonator 22 and the conductive wire part 11a overlap with each other remains, when the planar direction B5 of the long side of the conductive wire part 11a or the planar direction B6 of the short side of the conductive wire part 11a is displaced toward the long-side direction/the short-side direction of the rectangular conductor ring. This is because a resonance wavelength of the resonator is approximately the same as the arrangement spacing so that the above displacement amount will be sufficiently smaller than the resonance wavelength.

In the sixth application example as described above, only by changing how the ring-type resonator 22 overlaps with the conductive wire part 11a, the resonance frequency of the resonator can flexibly be changed without changing the main resonator 11.

Seventh Application Example

Figure 18:
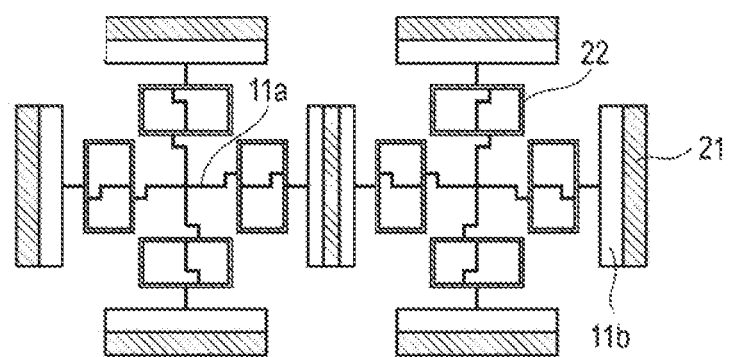
FIG. 18 illustrates a seventh application example of a combination of a main resonator and sub-resonators of an electromagnetic field band-stop filter according to an embodiment of the present invention.
Figure 19:
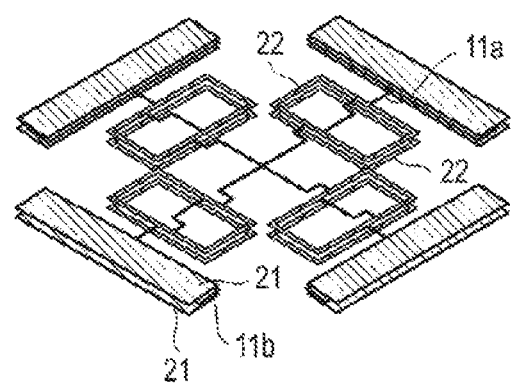
FIG. 19 illustrates an example of disposition of a conductive wire part of the main resonator, the patch-type resonator, and the ring-type resonator in the seventh application example of the combination of the main resonator and the sub-resonators of the electromagnetic field band-stop filter according to the embodiment of the present invention.

Next, a seventh application example of a combination of a main resonator and a sub-resonator of an electromagnetic field band-stop filter according to an embodiment of the present invention will be described. FIG. 18 illustrates a seventh application example of a combination of a main resonator and sub-resonators of an electromagnetic field band-stop filter according to an embodiment of the present invention. FIG. 19 illustrates an example of disposition of a conductive wire part of the main resonator, the patch-type resonator, and the ring-type resonator in the seventh application example of the combination of the main resonator and the sub-resonators of the electromagnetic field band-stop filter according to the embodiment of the present invention.

As illustrated in FIGS. 18 and 19, in the seventh application example, the electromagnetic field band-stop filter is constituted by combining the main resonator 11 illustrated in FIG. 1, the patch-type resonator 21 illustrated in FIG. 2, and the ring-type resonator 22 illustrated in FIG. 3.

Since this configuration includes the configuration described in the first application example as well as the configuration described in the fourth application example, both the inductance and the capacitance of the resonator can be increased. Thus, compared with the first and fourth application examples, the resonance frequency of the resonator can be further lowered.

In addition, as described in the first application example, two patch-type resonators 21 can be disposed in such a manner to sandwich the electrode plate parts 11b of the main resonator 11 to form a three-layer combination. In addition, as described in the fourth application example, two ring-type resonators 22 can also be disposed in such a manner to sandwich the conductive wire part 11a of the main resonator 11 to form a three-layer combination. In this way, compared with the above cases with two layers, the inductance and capacitance are further increased, and the resonance frequency can be further lowered.

Eighth Application Example

Next, an eighth application example of a combination of a main resonator and a sub-resonator of an electromagnetic field band-stop filter according to an embodiment of the present invention will be described.

A configuration in this application example includes the configuration described in the second application example as well as the configuration described in the fifth application example, and by changing the length of each side of the patch-type resonator 21, the distance d1 between the patch-type resonator 21 and the electrode plate part 11b, the length of each side of the ring of the ring-type resonator 22, and the distance d2 between the ring-type resonator 22 and the conductive wire part 11a, the magnitude of the capacitance and the effective inductance of the resonator are changed so that the resonance frequency of the resonator can be changed.

In addition, since the patch-type resonator 21 is disposed in a different layer from that of the electrode plate part 11b of the main resonator 11, and the ring-type resonator 22 is disposed in a different layer from that of the conductive wire part 11a of the main resonator 11, these components can separately be carried before the resonator is used. Namely, by separately preparing the patch-type resonators 21 and the ring-type resonators 22 of various sizes and appropriately selecting the size of the patch-type resonator 21, the size of the ring-type resonator 22, and the above distances d1 and d2, the magnitude of the capacitance and the effective inductance of the resonator can be changed so that the resonance frequency band can be selected.

Ninth Application Example

Next, a ninth application example of a combination of a main resonator and a sub-resonator of an electromagnetic filed band-stop filter according to an embodiment of the present invention will be described.

In this application example, as described in the eighth application example, by changing the length of each side of the patch-type resonator 21, the distance d1 between the patch-type resonator 21 and the electrode plate part 11b, the length of each side of the ring of the ring-type resonator 22, and the distance d2 between the ring-type resonator 22 and the conductive wire part 11a, the magnitude of the capacitance and the effective inductance of the resonator are changed. Thus, unlike the fourth application example, since the capacitance can also be changed, the Q-factor can be changed without changing a center frequency at resonance.

Next, examples of a relationship between a resonance frequency [GHz] and transmission characteristics (XYPlot2) S21 [dB] of an electromagnetic field band-stop filter according to an embodiment of the present invention will be described.

Figure 20:
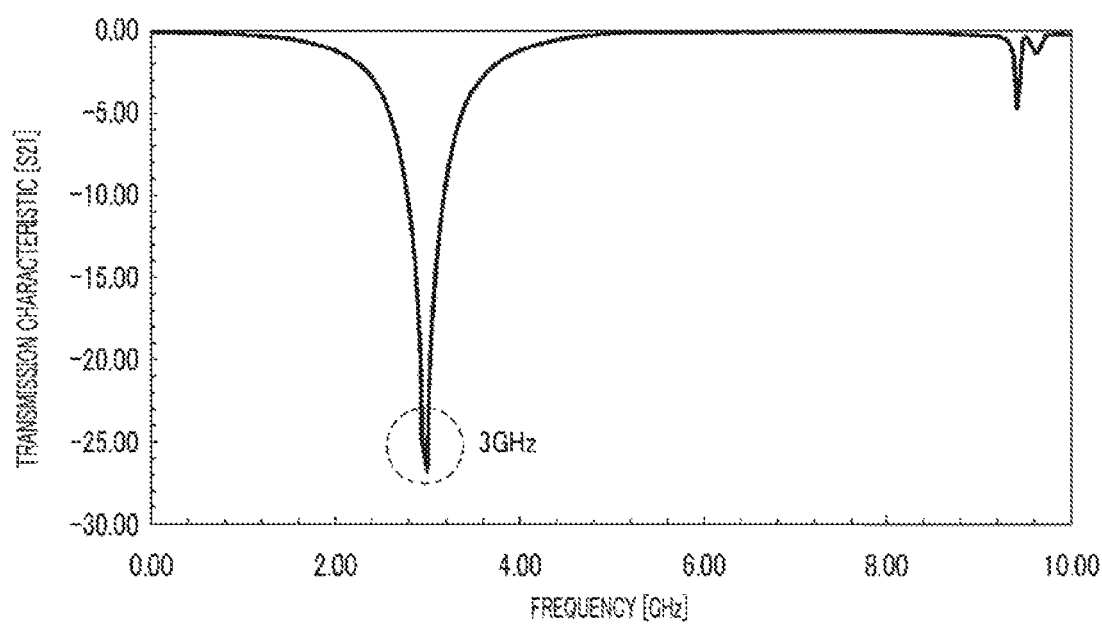
FIG. 20 illustrates a first example of a relationship between a resonance frequency [GHz] and transmission characteristics S21 [dB] of an electromagnetic field band-stop filter according to an embodiment of the present invention.

FIG. 20 illustrates a first example of a relationship between a resonance frequency [GHz] and transmission characteristics S21 [dB] of an electromagnetic field band-stop filter according to an embodiment of the present invention.

Figure 21:
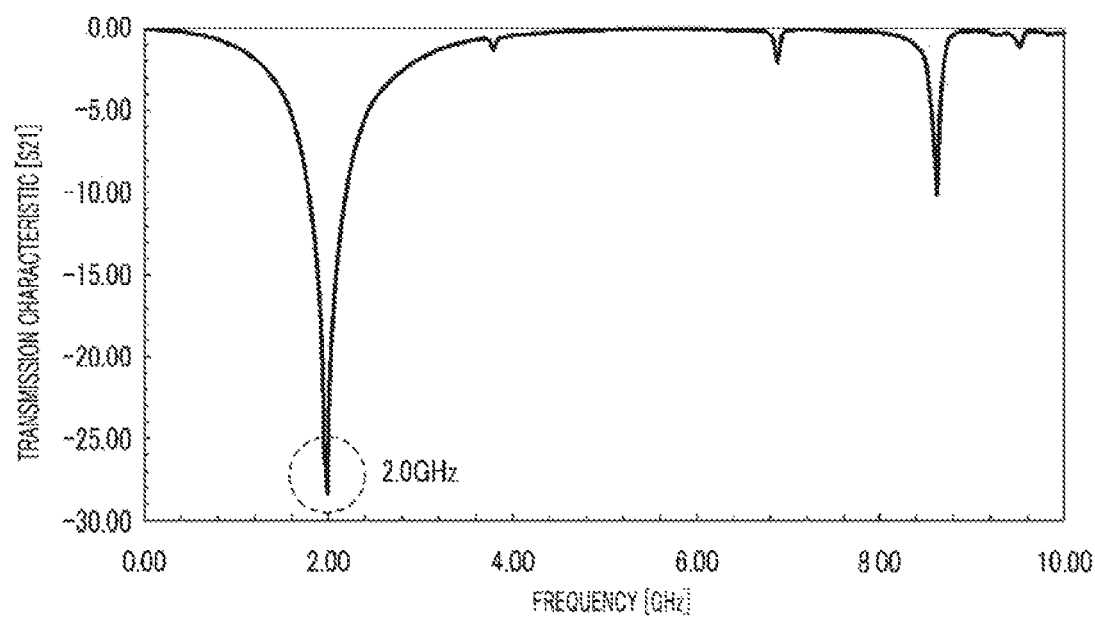
FIG. 21 illustrates a second example of a relationship between a resonance frequency [GHz] and transmission characteristics S21 [dB] of an electromagnetic field band-stop filter according to an embodiment of the present invention.
Figure 22:
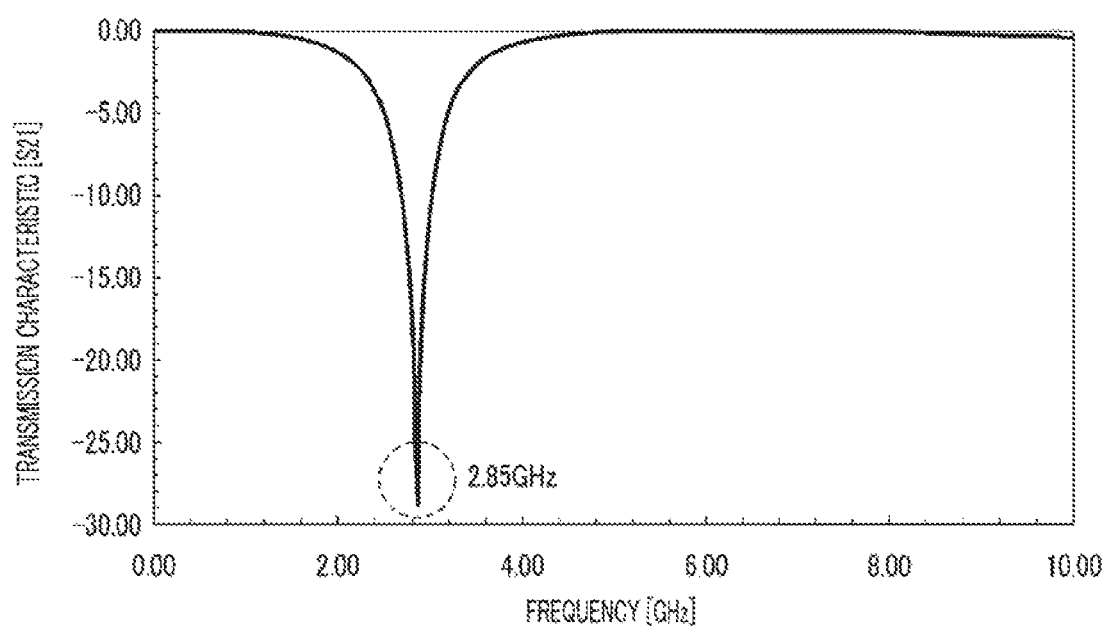
FIG. 22 illustrates a third example of a relationship between a resonance frequency [GHz] and transmission characteristics S21 [dB] of an electromagnetic field band-stop filter according to an embodiment of the present invention.
Figure 23:
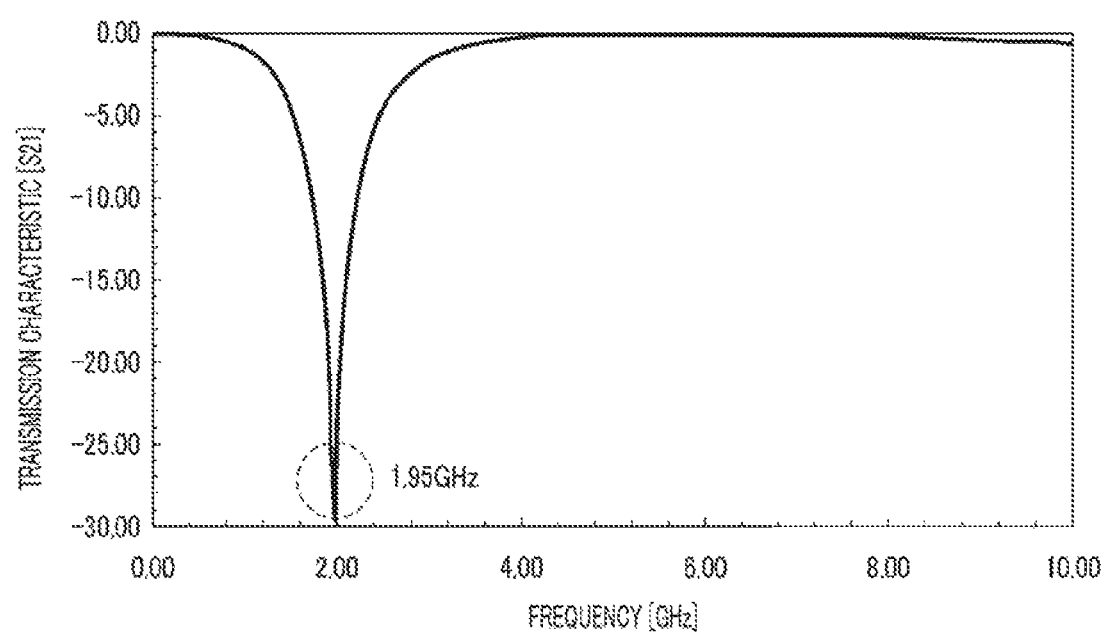
FIG. 23 illustrates a fourth example of a relationship between a resonance frequency [GHz] and transmission characteristics S21 [dB] of an electromagnetic field band-stop filter according to an embodiment of the present invention.

FIG. 21 illustrates a second example of a relationship between a resonance frequency [GHz] and transmission characteristics S21 [dB] of an electromagnetic field band-stop filter according to an embodiment of the present invention. FIG. 22 illustrates a third example of a relationship between a resonance frequency [GHz] and transmission characteristics S21 [dB] of an electromagnetic field band-stop filter according to an embodiment of the present invention. FIG. 23 illustrates a fourth example of a relationship between a resonance frequency [GHz] and transmission characteristics S21 [dB] of an electromagnetic field band-stop filter according to an embodiment of the present invention.

FIG. 20 illustrates characteristics in a case where no sub-resonator is combined with the main resonator 11, and the resonance frequency is 3.0 [GHz].

FIG. 21 illustrates characteristics in a case where the patch-type resonator 21 is combined with the main resonator 11, and the resonance frequency is 2.0 [GHz].

FIG. 22 illustrates characteristics in a case where the ring-type resonator 22 is combined with the main resonator 11, and the resonance frequency is 2.85 [GHz].

FIG. 23 illustrates characteristics in a case where the patch-type resonator 21 and the ring-type resonator 22 are combined with the main resonator 11, and the resonance frequency is 1.95 [GHz].

As indicated in the above examples, by combining a sub-resonator with the main resonator 11, the resonance frequency can be shifted to a low frequency band.

The above examples also indicate that, compared with the case where the patch-type resonator 21 is combined with the main resonator 11 and the case where the ring-type resonator 22 is combined with the main resonator 11, the resonance frequency can be shifted to even lower frequency band when the patch-type resonator 21 and the ring-type resonator 22 are combined with the main resonator 11.

(Effects Generated by the Embodiments of the Present Invention)

According to the embodiments of the present invention, compared with the conventional techniques, an electromagnetic field band-stop filter used in a certain frequency band can be further miniaturized. Thus, the electromagnetic field band-stop filter that corresponds to electromagnetic information leakage in a frequency band (for example, 700 [MHz] or lower) lower than a frequency used for wireless communication can be disposed in sufficient numbers in a limited space, and desired frequency characteristics can be exhibited.

In addition, by using the electromagnetic field band-stop filter according to any of the embodiments, a sufficiently small structure with respect to a target frequency (wavelength) can be achieved. The electromagnetic field band-stop filter is constituted of the arrangement of a finite number of resonators in a limited space, and the arrangement number can be further increased. Therefore, improvement in the accuracy of the frequency characteristics can be expected. Also, even in a small space, the electromagnetic field band-stop filter having desired frequency characteristics can be arranged in sufficient numbers.

In addition, since the resonance frequency of the electromagnetic field band-stop filter can be designed in a lumped-constant manner, even an engineer who is not familiar with antenna design techniques can easily design an electromagnetic field band-stop filter having desired characteristics. Consequently, obstacles to development can be reduced.

In addition, due to the increase in the number of base stations through the improvement of the radio environment, there has been an issue of efficient use of the space needed for antennas or reflection plates in the individual base stations. In particular, the proportion of the space needed for a reflection plate in the entire space is relatively large. By applying the electromagnetic field band-stop filter according to any of the embodiments to such environment, the reflection plate (in a case of the FSSs) used in the base station can be made sufficiently small so that the base station can be installed in a location where the installation has been difficult.

In each embodiment of the present invention, by preparing several types of patterns of the sub-resonator to correspond to the patterns of the main resonator 11, if the frequency is within a specific range (for example, approximately 2 to 3 [GHz] at maximum), the resonance frequency can be controlled without changing the size of the main resonator 11. Therefore, in each case, a resonance frequency band which corresponds to, for example, the type of sub-resonator, the arrangement pattern, how the sub-resonator and the main resonator overlap with each other, etc. can be grasped in advance. Thus, even an engineer who is not familiar with the antenna design techniques in detail can easily set a center frequency and a bandwidth of the operation characteristics of the FSS.

Namely, when an on-site worker who handles failures/malfunction caused by radiation noise or radio interference, communication failures, or the like measures the intensity of radio waves on site and grasps such state, the on-site worker is able to prepare a noise filter appropriate to the state and immediately handle the above situation. Thus, a time lag that conventionally occurs from the site survey to the failure handling can be eliminated, and costs for preparing countermeasure products for each frequency band to handle the failure can significantly be reduced.

The present invention is not limited to the embodiments described above, and various modifications can be made in the implementation phase without departing from the scope of the gist thereof. The above embodiments may be appropriately combined as far as possible to be implemented, and combined effects can be obtained in such case. Further, the above embodiments contain inventions of various stages, and the inventions of various stages can be extracted by adequately combining a plurality of constituents disclosed in the embodiments.

REFERENCE SIGNS LIST

11 Main resonator
11a Conductive wire part
11b Electrode plate part
21 Patch-type resonator
22 Ring-type resonator
31 Substrate

The invention claimed is:

1. An electromagnetic field band-stop filter, comprising a plurality of unit structures that have reflection characteristics on an electromagnetic wave of a predetermined frequency, wherein each of the plurality of unit structures includes: a plurality of electrode parts each of which is disposed along a side of a polygon in a non-contact manner with another electrode part; and a plurality of conductor parts which are provided for the plurality of electrode parts on a one-to-one basis and each of which has at least one bent portion between one end and an other end, the one ends of the plurality of conductor parts being connected to the electrode parts on a one-to-one basis and the other ends of the plurality of conductor parts being connected at one point on an inner side of the electrode parts in the individual unit structure, wherein the plurality of unit structures are regularly and two-dimensionally disposed by disposing electrode parts of the plurality of unit structures to be adjacent to each other with a spacing that reflects the predetermined frequency, wherein the plurality of electrode parts each of which has a flat-plate portion and is disposed in such a manner that a long side of the flat-plate portion is disposed along a side of the polygon, wherein the bent portion of the conductor part has a shape forming an outline between one end and the other end of the conductor part, wherein the electromagnetic field band-stop filter further includes a first sub-resonator forming a conductive plate that is disposed overlapping at least a part of the flat-plate portion of each of the adjacent electrode parts with a predetermined spacing therebetween and that adds electrical capacitance in parallel to electrical capacitance which the adjacent electrode parts have, and wherein the electromagnetic field band-stop filter further includes a second sub-resonator which has a ring shape corresponding to a shape of an outline formed by the bent portion of the conductor part and which is disposed in such a manner that at least a part of the ring shape two-dimensionally overlaps with at least a part of the bent portion of the conductor part so that, when a current flows through the ring shape, a direction of the current in at least a part of the ring shape becomes the same as, when a current flows through the conductor part, a direction of the current in at least a part of the bent portion of the conductor part.

2. An electromagnetic field band-stop filter, comprising a plurality of unit structures that have reflection characteristics on an electromagnetic wave of a predetermined frequency, wherein each of the plurality of unit structures includes: a plurality of electrode parts each of which is disposed along a side of a polygon in a non-contact manner with another electrode part; and a plurality of conductor parts which are provided for the plurality of electrode parts on a one-to-one basis and each of which has at least one bent portion between one end and an other end, the one ends of the plurality of conductor parts being connected to the electrode parts on a one-to-one basis and the other ends of the plurality of conductor parts being connected at one point on an inner side of the electrode parts in the individual unit structure, wherein the plurality of unit structures are regularly and two-dimensionally disposed by disposing electrode parts of the plurality of unit structures to be adjacent to each other with a spacing that reflects the predetermined frequency; wherein the plurality of electrode parts each of which has a flat-plate portion and is disposed in such a manner that a long side of the flat-plate portion is disposed along a side of the polygon, and wherein the electromagnetic field band-stop filter further includes a sub-resonator forming a conductive plate that is disposed overlapping at least a part of the flat-plate portion of each of the adjacent electrode parts with a predetermined spacing therebetween and that adds electrical capacitance in parallel to electrical capacitance which the adjacent electrode parts have.

3. The electromagnetic field band-stop filter according to claim 2, wherein a spacing between the sub-resonator and the electrode part is one tenth or less of an arrangement spacing between the plurality of unit structures.

4. An electromagnetic field band-stop filter, comprising a plurality of unit structures that have reflection characteristics on an electromagnetic wave of a predetermined frequency, wherein each of the plurality of unit structures includes: a plurality of electrode parts each of which is disposed along a side of a polygon in a non-contact manner with another electrode part; and a plurality of conductor parts which are provided for the plurality of electrode parts on a one-to-one basis and each of which has at least one bent portion between one end and an other end, the one ends of the plurality of conductor parts being connected to the electrode parts on a one-to-one basis and the other ends of the plurality of conductor parts being connected at one point on an inner side of the electrode parts in the individual unit structure, wherein the plurality of unit structures are regularly and two-dimensionally disposed by disposing electrode parts of the plurality of unit structures to be adjacent to each other with a spacing that reflects the predetermined frequency, wherein the bent portion of the conductor part has a shape forming an outline between one end and the other end of the conductor part, and wherein the electromagnetic field band-stop filter further includes a sub-resonator which has a ring shape corresponding to a shape of an outline formed by the bent portion of the conductor part and which is disposed in such a manner that at least a part of the ring shape two-dimensionally overlaps with at least a part of the bent portion of the conductor part so that, when a current flows through the ring shape, a direction of the current in at least a part of the ring shape becomes the same as, when a current flows through the conductor part, a direction of the current in at least a part of the bent portion of the conductor part.

5. The electromagnetic field band-stop filter according to claim 4, wherein a spacing between the sub-resonator and the conductor part is one tenth or less of an arrangement spacing between the plurality of unit structures.

6. The electromagnetic field band-stop filter according to claim 4, wherein a length of the conductor part in a short-side direction is shorter than a short side of the electrode part.

* * * * *